July 21, 1964 R. Q. TILLMAN 3,142,023
QUADRATURE OSCILLATOR
Filed Aug. 6, 1962
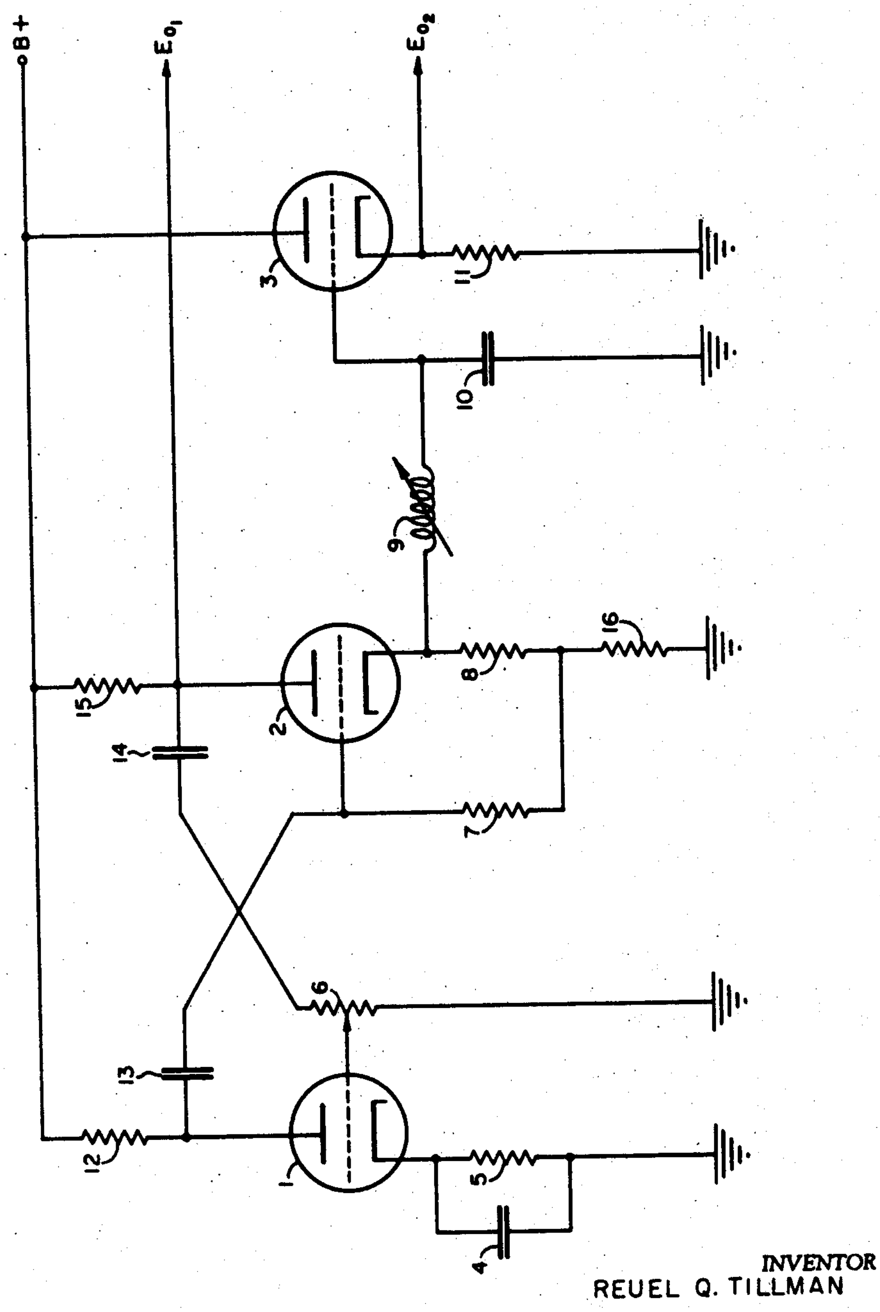
INVENTOR
REUEL Q. TILLMAN
BY Eugene F. Malin, Agent
Richard G. Reed
ATTORNEY

United States Patent Office 3,142,023

Patented July 21, 1964

3,142,023

QUADRATURE OSCILLATOR

Reuel Q. Tillman, 8465 Livingston Road, Washington, D.C.

Filed Aug. 6, 1962, Ser. No. 215,251
6 Claims. (Cl. 331—45)
(Granted under Title 35, U.S. Code (1952), sec. 266)

The invention described herein may be manufactured and used by or for the Government of the United States of America for governmental purposes without the payment of any royalties thereon or therefor.

This invention relates to a quadrature oscillator and more particularly to a variable frequency oscillator capable of producing two voltages that are automatically quadrature with respect to one another.

Heretofore the production of two signals of the same variable frequency but having phase quadrature relationship has been accomplished in several ways, none of which is considered entirely satisfactory. Electrical phase shifting networks fed by oscillators have been used. Such systems are rather cumbersome. They are critical of adjustment, operating frequency and component values. Since the necessary phase shift elements are dependent on frequency, it follows that phasing of a variable frequency operation must be adjusted in combination with frequency variation adjustments. Calibration of such systems becomes time consuming and difficult. As component values change over a period of time, recalibration also becomes necessary.

It is accordingly an object of the present invention to provide an oscillator having a variable frequency and producing two voltages having a constant phase difference irrespective of frequency.

Another object is to provide a quadrature oscillator of improved quadrature stability.

Another object is to provide an oscillator designed to produce two output voltages constantly in quadrature irrespective of frequency.

A further object is to provide an improved quadrature oscillator that produces a pair of output signals which are relatively economical in construction and independent of critical component values.

These and other objects, advantages and novel features of the invention will be apparent from the following description and the accompanying drawing.

The single figure of the drawing is a schematic diagram of a simple embodiment of the present invention.

In accordance with the invention the variable frequency device produces two output signals at quadrature phase relationship without requiring phase adjustment. The apparatus contains an amplifier, having positive and negative feedback, which is rendered frequency selective by shunting the degeneration or negative feedback means with a series resonant L-C circuit. The negative feedback goes to a low value at the resonant frequency of the series resonant circuit. The gain of the amplifier is greater at the resonant frequency of the series resonant L-C circuit and the amplifier will oscillate producing sine waveforms. Two output signals are produced with a phase difference of 90°.

Since the L-C circuit is the frequency determining element of the circuit, quadrature is automatically achieved and maintained. No special quadrature network adjustments are necessary after each change of frequency or frequency drift of the oscillator. An added convenience is that no special design is required for the inductance or capacitance. Therefore any two terminal inductance having suitable inductance value and reasonable Q may be used.

Referring now to the drawing and considering the circuit without the series L-C circuit and its coupling to tube 3, B+ is connected to the plates of triode 1 and triode 2 through load resistor 12 and load resistor 15, respectively. Electron tube 1 is an ordinary R-C coupled stage whose gain may be varied by potentiometer 6. Electron tube 2 is an amplifier stage having cathode degeneration produced largely by resistance 16. Resistor 8 is mainly for bias purposes, if unbypassed it also contributes to the cathode degeneration or negative feedback. Since the output from the plate of tube 1 furnishes the input to the grid of tube 2 through capacitor 13 and the output from the plate of tube 2 furnishes the input to the grid of tube 1 through capacitor 14, the two stages form sort of a relaxation oscillator and will oscillate as a relaxation oscillator whenever the gain control potentiometer 6 is adjusted for sufficient overall gain. Resistor 5 and capacitor 4 are bias voltage means for tube 1. If resistor 16 is quite large considerable cathode degeneration or negative feedback results. The gain control potentiometer 6 would have to be advanced to cause oscillation when resistor 16 is increased. The cathode degeneration means is not frequency sensitive but covers the entire bandpass of stages 1 and 2.

The introduction of an L-C series circuit across the negative feedback means will now be considered. The inductance 9 and capacitance 10 form a series circuit. The L-C series circuit shunts the cathode to ground circuit of the tube 2. Tube 3 and resistor 11 form a cathode follower stage for isolation purposes. Tube 3 provides output $E_{02}$ which prevents loading of the L-C shunting circuit. The grid of tube 3 is connected to the junction of the inductance and capacitance of the shunting circuit. The first output voltage shown at $E_{01}$ is obtained from the plate of tube 2. An output voltage $E_{01}$ may be obtained from other suitable points as across the series L-C circuit or from the plate of tube 1. The L-C circuit makes the cathode degeneration means of tube 2 frequency sensitive. Degeneration will go to a low value at the resonant frequency of the L-C series circuit. When gain control potentiometer is advanced from its zero gain setting, a gain setting will be reached at which the amplifier breaks into oscillation at the series resonant frequency of the series L-C shunt, producing the two output voltages $E_{01}$, and $E_{02}$ of excellent sine waveform. The series L-C shunt is the frequency determining device.

The cathode and plate of tube 2 are effectively 180° out-of-phase with respect to each other. The cathode of tube 2 is the input to the L-C series circuit. The voltage across inductance 9 is approximately 90° leading the cathode voltage of tube 2. The voltage across capacitance 10 is 90° lagging the cathode voltage of tube 2. Since capacitance 10 can generally be obtained with less resistance than inductance 9, the voltage across capacitance 10 is usually used as the signal voltage to tube 3. Utilizing the voltage across capacitor 10 as the signal voltage to cathode follower tube 3 has the further advantage of allowing the cathode bias voltage of tube 2 to be transferred to the grid of tube 3. This allows larger output voltages from tube 3 without an R-C coupling network. The second output voltage shown at $E_{02}$ is obtained from tube 3.

Increasing the gain setting of potentiometer 6 from the "just oscillate" setting, increases the amplitude of oscillation and the output from the plate of tube 2. The output from the cathode of tube 3 increases in the same proportion. By proper circuit design large signal output voltages of excellent sine waveform may be obtained. For example, a 100 volt peak signal using a 300 volt supply can be readily obtained. This circuit can give very precise quadrature voltages from sub-audio frequencies to frequencies at which the plate begins to depart from being effectively 180° out-of-phase with respect to the cathode. The precision of quadrature is largely dependent upon the phase angle of the element used for obtaining the $E_{02}$ signal.

It is apparent that various changes could be made in the apparatus without departing from the invention as claimed. The circuit could be transistorized or other amplifying devices used.

The present invention is not restricted to the circuit arrangements shown by way of example in the accompanying drawing. The invention relates, in fact, broadly to all generator circuit arrangements whose frequency is determined by series L-C resonance and capable of supplying two alternating voltages shifted in phase by approximately 90° with respect to each other, without adjustment. A simple embodiment of the disclosure relates to an amplifier circuit using both positive and negative feedback, the negative feedback can be made frequency sensitive by shunting it with an L-C series circuit. At the resonant frequency of the L-C series circuit, the negative feedback is reduced sufficiently for the amplifier to oscillate. At this resonant frequency the voltage across either L or C will be very nearly quadrature with respect to the voltage across the L-C series combination.

Obviously many other modifications and variations of the present invention are possible within the scope of my invention. It is therefore to be understood that within the scope of the appended claims, the invention may be practiced otherwise than as specifically described.

What is claimed is:

1. A signal generating means having output and input terminals, a first output signal produced at the output terminals of said generating means, a negative feedback means connected between said output and input terminals, an inductance-capacitance series resonant circuit shunting said negative feedback means, therefore the said negative feedback means is frequency sensitive, a means connected between the inductance-capacitance series resonant circuit whereby the second output signal is produced, said first and second output signals being in a selected phase relation.

2. A generating means as claimed in claim 1 in which said generating means is an oscillator, an amplifier means in said oscillator connected to said feedback means, said resonant circuit reducing the impedance of the negative feedback sufficiently for said amplifier to oscillate thereby producing said first and second output signals.

3. An oscillator comprising an amplifier means having an output and an input, a negative feedback means connected between the output and the input of said amplifier means, an inductance-capacitance means connected across said feedback means, said inductance-capacitance means at resonance bypasses said feedback means, thereby allowing the amplifier to oscillate, the said amplifier means produces a first output signal, a terminal between the inductance-capacitance means, the said terminal produces a second output signal, the two output signals are thereby produced automatically at quadrature.

4. An apparatus for producing two output signals in selected phase relation comprising: a generating means for producing a first output signal, a negative feedback means connected to said generating means, an inductance-capacitance series resonant circuit having at least one narrow bypass frequency, said resonant means shunting said feedback means at said bypass frequency, thereby said feedback means becomes frequency sensitive when shunted by said resonant means, an intermediate point in said resonant means for producing a second output signal whereby the first and second signals are automatically at quadrature.

5. An amplifier circuit using both positive and negative feedback comprising:

amplifier means having an input and an output;
negative feedback means connected between the output and the input of said amplifier means;
shunting means;
said shunting means comprising a series resonant circuit;
said feedback means being made frequency sensitive by placing said shunting means across it, so that at a selected frequency the impedance of said feedback means is reduced to allow said amplifier means to oscillate, said shunting means being operative at said selected frequency,
thereby producing at said selected frequency a signal at an intermediate point in said shunting means that will be at quadrature with respect to a signal across said shunting means.

6. An amplifier circuit using both positive and negative feedback comprising:

amplifier means having an input and an output;
negative feedback means connected between the output and the input of said amplifier means;
shunting means;
said shunting means comprising an inductance-capacitance circuit;
said feedback means being made frequency sensitive by placing said shunting means across it, so that at a selected frequency the impedance of said feedback means is reduced to allow said amplifier means to oscillate, said shunting means being operative at said seleced frequency,
thereby producing at said selected frequency a signal at an intermediate point in said shunting means that will be at quadrature with respect to a signal across said shunting means.

References Cited in the file of this patent

UNITED STATES PATENTS

| | | |
|---|---|---|
| 2,406,082 | Lange | Aug. 20, 1946 |
| 2,472,598 | Loughlin | June 7, 1949 |
| 2,593,005 | Bridges | Apr. 15, 1952 |
| 2,764,643 | Sulzer | Sept. 25, 1956 |
| 2,778,940 | Sulzer | Jan. 22, 1957 |